(12) United States Patent
Tamaoki et al.

(10) Patent No.: US 7,942,974 B2
(45) Date of Patent: May 17, 2011

(54) METHOD OF CLEANING A FILM-FORMING APPARATUS

(75) Inventors: Naoki Tamaoki, Tokyo (JP); Yuusuke Sato, Tokyo (JP); Jun Sonobe, Tsukuba (JP); Takamitsu Shigemoto, Tsukuba (JP); Takako Kimura, Urayasu (JP)

(73) Assignees: Kabushiki Kaisha Toshiba, Tokyo (JP); L'Air Liquide, Paris (FR)

( * ) Notice: Subject to any disclaimer, the term of this patent is extended or adjusted under 35 U.S.C. 154(b) by 1010 days.

(21) Appl. No.: 11/234,105

(22) Filed: Sep. 26, 2005

(65) Prior Publication Data

US 2006/0065289 A1 Mar. 30, 2006

(30) Foreign Application Priority Data

Sep. 29, 2004 (JP) ................................ 2004-285189

(51) Int. Cl.
*B08B 9/08* (2006.01)
(52) U.S. Cl. ............... 134/2; 134/19; 134/22.1; 134/36
(58) Field of Classification Search ................ 134/19, 134/36, 2
See application file for complete search history.

(56) References Cited

U.S. PATENT DOCUMENTS

| 4,421,592 A * | 12/1983 | Shuskus et al. ............... 117/103 |
| 6,554,909 B1 * | 4/2003 | Haerle et al. ..................... 134/6 |
| 2003/0047445 A1 * | 3/2003 | Tojo et al. .................. 204/243.1 |
| 2004/0182423 A1 * | 9/2004 | Nakao ........................... 134/22.1 |
| 2005/0082002 A1 | 4/2005 | Sato et al. |

FOREIGN PATENT DOCUMENTS

| JP | 3014368 | 12/1999 |
| JP | 2001-267241 | 9/2001 |
| JP | 2002100618 A * | 4/2002 |
| JP | 2002-158181 | 5/2002 |
| JP | 2002-184765 | 6/2002 |
| JP | 2003-59915 | 2/2003 |
| JP | 2003-178986 | 6/2003 |

OTHER PUBLICATIONS

Machine Translation of JP 2002-100618 A by Ono et al., Japanese Patent Application Publication, Apr. 2002.*
Computer Translation of JP 2003-178986 by Ono et al., published Jun. 27, 2003.*

* cited by examiner

*Primary Examiner* — Michael Kornakov
*Assistant Examiner* — Ryan Coleman
(74) *Attorney, Agent, or Firm* — Oblon, Spivak, McClelland, Maier & Neustadt, L.L.P.

(57) ABSTRACT

A method of cleaning a film-forming apparatus to remove a silicon-based material deposited on a constituent member of the film-forming apparatus after being used to form thin films includes introducing a first gas including fluorine gas and a second gas including carbon monoxide gas into the film-forming apparatus, and heating the constituent member. The constituent member includes quartz or silicon carbide and the silicon-based material includes silicon nitride, or the constituent member includes silicon carbide and the silicon-based material includes silicon oxide.

17 Claims, 6 Drawing Sheets

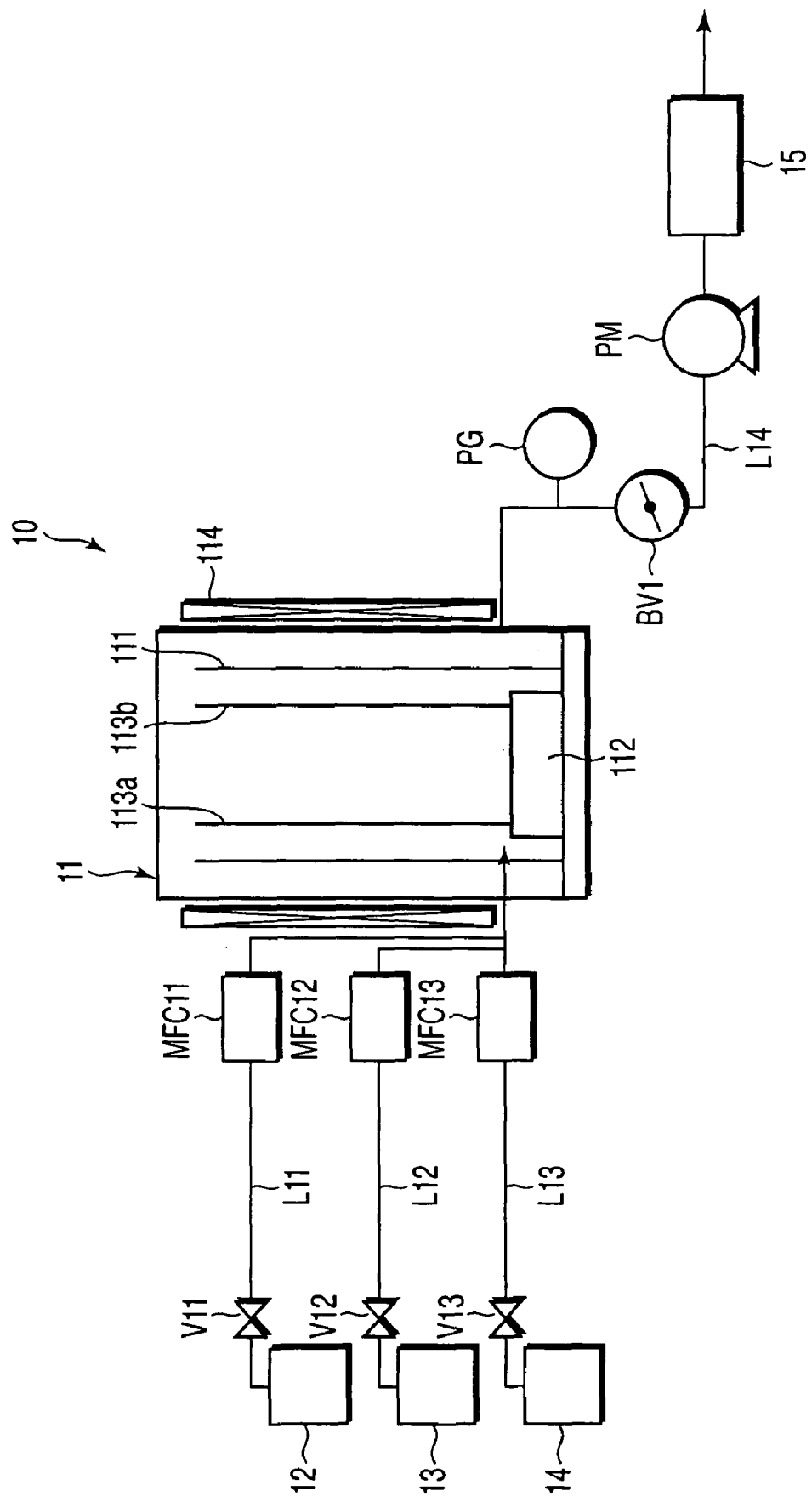
F I G. 2

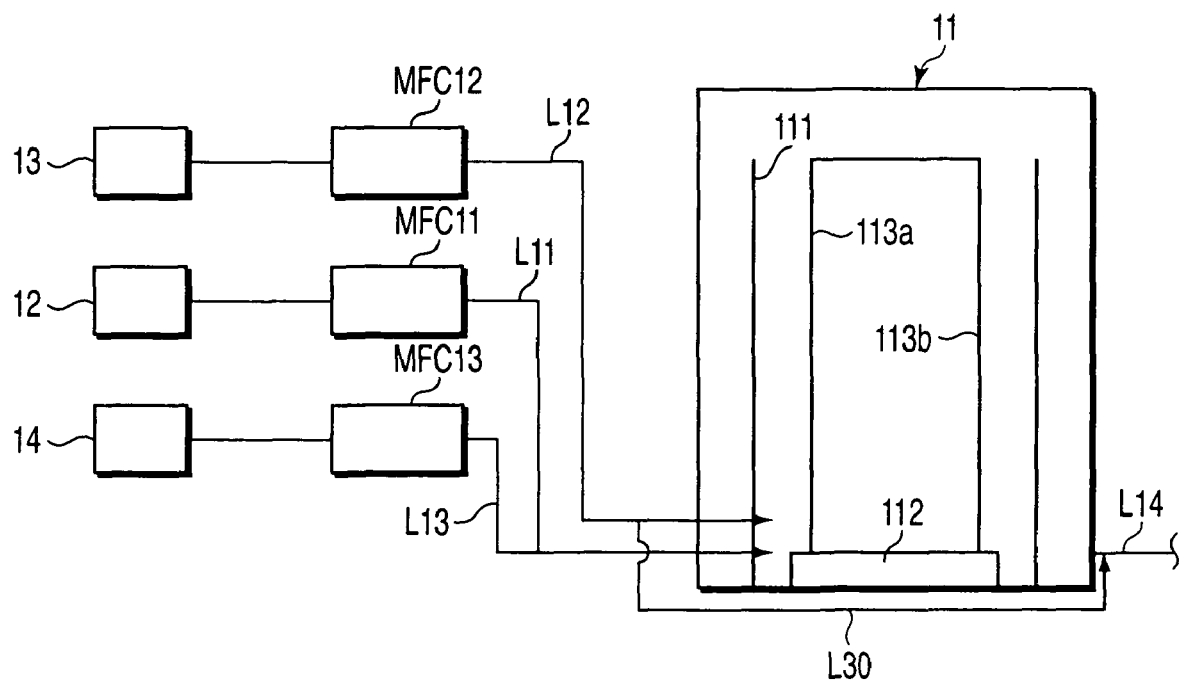
F I G. 7
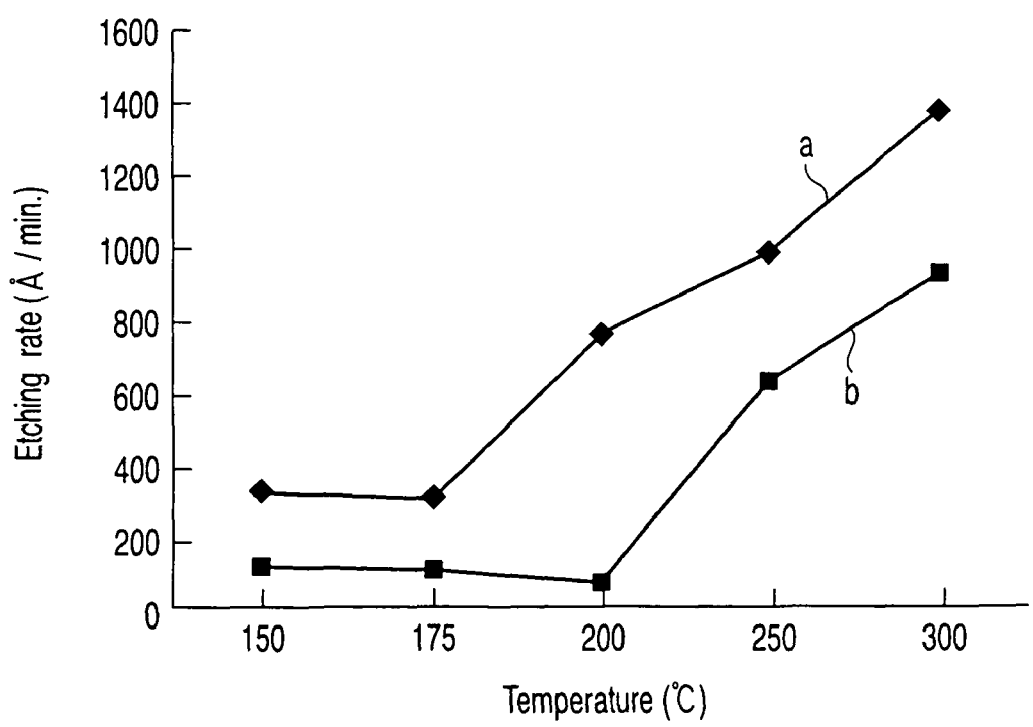
F I G. 8

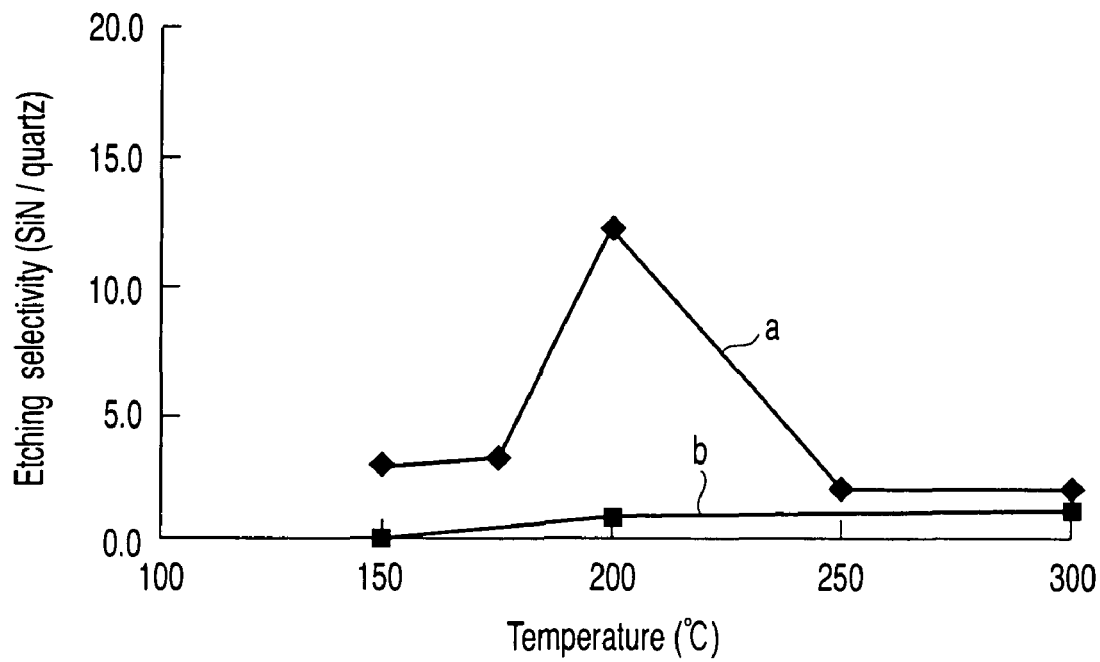
F I G. 9
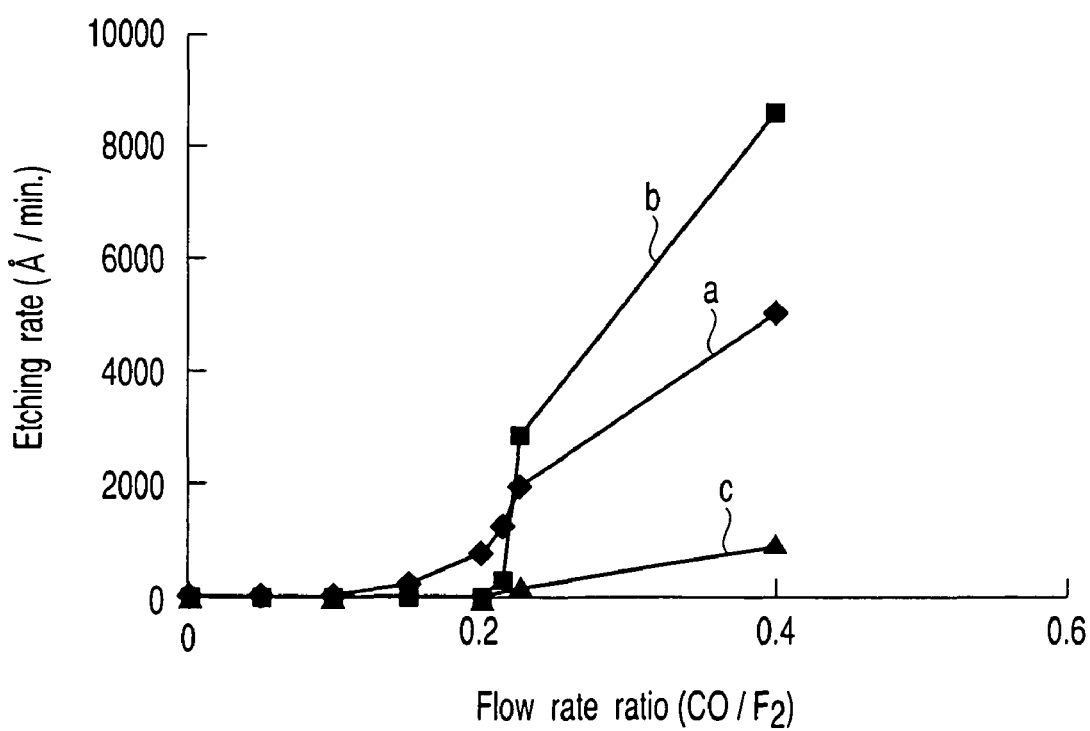
F I G. 10

METHOD OF CLEANING A FILM-FORMING APPARATUS

CROSS-REFERENCE TO RELATED APPLICATIONS

This application is based upon and claims the benefit of priority from prior Japanese Patent Application No. 2004-285189, filed Sep. 29, 2004, the entire contents of which are incorporated herein by reference.

BACKGROUND OF THE INVENTION

1. Field of the Invention

The present invention relates to a method of cleaning a film-forming apparatus and a film-forming apparatus equipped with a cleaning system, and more particularly, a method and a film-forming apparatus for cleaning off a silicon-based deposits including silicon oxide or silicon nitride deposited in the film-forming apparatus.

2. Description of the Related Art

In manufacturing a semiconductor device, various (insulating) thin films such as a silicon dioxide film or a silicon nitride film are formed by using a film-forming apparatus comprising a chemical vapor deposition reaction chamber (CVD reaction chamber). In forming the thin film, the CVD reaction product is deposited not only on the surface of a target semiconductor wafer but also on the constituent member of the film-forming apparatus such as the wall of the CVD reaction chamber, the boat or susceptor for supporting the semiconductor wafer, or piping. The CVD reaction product deposited on the constituent members, if left unremoved, peels off from, for example, the inner wall of the CVD reaction chamber. This generates particles and results in degrading the semiconductor thin film formed on the wafer by the CVD reaction in the subsequent step. Thus, it is necessary to clean the film-forming apparatus.

For example, Japanese Patent No. 3014368 discloses the use of a cleaning gas consisting of hypofluoride gas such as $CF_3OF$, optionally added with an oxygen-containing gas, to clean off silicon oxide or silicon nitride. Jpn. Pat. Appln. KOKAI Publication 2002-158181 disclose the use of a cleaning gas consisting of $COF_2$ gas added with oxygen gas. Further, Jpn. Pat. Appln. KOKAI Publication 2002-18476 discloses the use of a cleaning gas consisting of $COF_2$ added with an additive gas such as fluorine gas.

More specifically, in the prior art techniques mentioned above, the cleaning gas is excited by means of a plasma, which is then subjected to the cleaning of the silicon-based deposits such as silicon oxide. However, as the plasma damages the constituent members of the film-forming apparatus, it is necessary to take measures to protect the constituent members. Further, plasma is unstable by itself and high in reactivity, and thus is difficult to control.

By contrast, in a thermal cleaning in which silicon-based deposits are cleaned off by the reaction of the silicon-based deposits with a cleaning gas under heat (thermal reaction), the cleaning can be controlled by the temperature in the cleaning, and the reactivity is not so high as to damage the constituent members of the film-forming apparatus.

However, the present inventors have found that the prior art cleaning gases described above can not perform a cleaning of silicon-based deposits sufficiently by heating alone, without using a plasma.

BRIEF SUMMARY OF THE INVENTION

Accordingly, an object of the present invention is to provide a method of cleaning a film-forming apparatus, and a film-forming apparatus, which can efficiently remove silicon-based deposits without causing significant damage to the constituent member of the film-forming apparatus by utilizing a thermal reaction.

According to a first aspect of the present invention, there is provided a method to remove a silicon-based material deposited on a constituent member of a film-forming apparatus after being used to form thin films, comprising: introducing a first gas comprising fluorine gas and a second gas comprising carbon monoxide gas into the film-forming apparatus; and heating the constituent member, wherein the silicon-based material comprises silicon nitride and the constituent member comprises quartz or silicon carbide, or wherein the silicon-based material comprises silicon oxide and the constituent member comprises silicon carbide.

According to a second aspect of the present invention, there is provided a film-forming apparatus including a reaction chamber configured to form a silicon nitride film or silicon dioxide film on a wafer therein, the apparatus comprising a first gas introducing system configured to introduce a first gas comprising fluorine gas into the reaction chamber, and a second gas introducing system configured to introduce a second gas comprising carbon monoxide gas into the reaction chamber.

BRIEF DESCRIPTION OF THE SEVERAL VIEWS OF THE DRAWING

FIG. 2 is a block diagram illustrating a film-forming apparatus equipped with a cleaning system according to another embodiment of the invention;

FIG. 7 is a block diagram illustrating a film-forming apparatus equipped with a cleaning system according to still another embodiment of the invention;

FIG. 8 is a graph showing the relationship between the etching rates of silicon nitride and quartz and the temperature;

FIG. 9 is a graph showing the relationship between the etching selectivity of silicon nitride/quartz and the flow rate ratio of carbon monoxide/fluorine gas; and FIG. 10 is a graph showing the relationship between the etching rates of silicon nitride, quartz and silicon carbide and the flow rate ratio of carbon monoxide/fluorine gas.

DETAILED DESCRIPTION OF THE INVENTION

Figure 1:
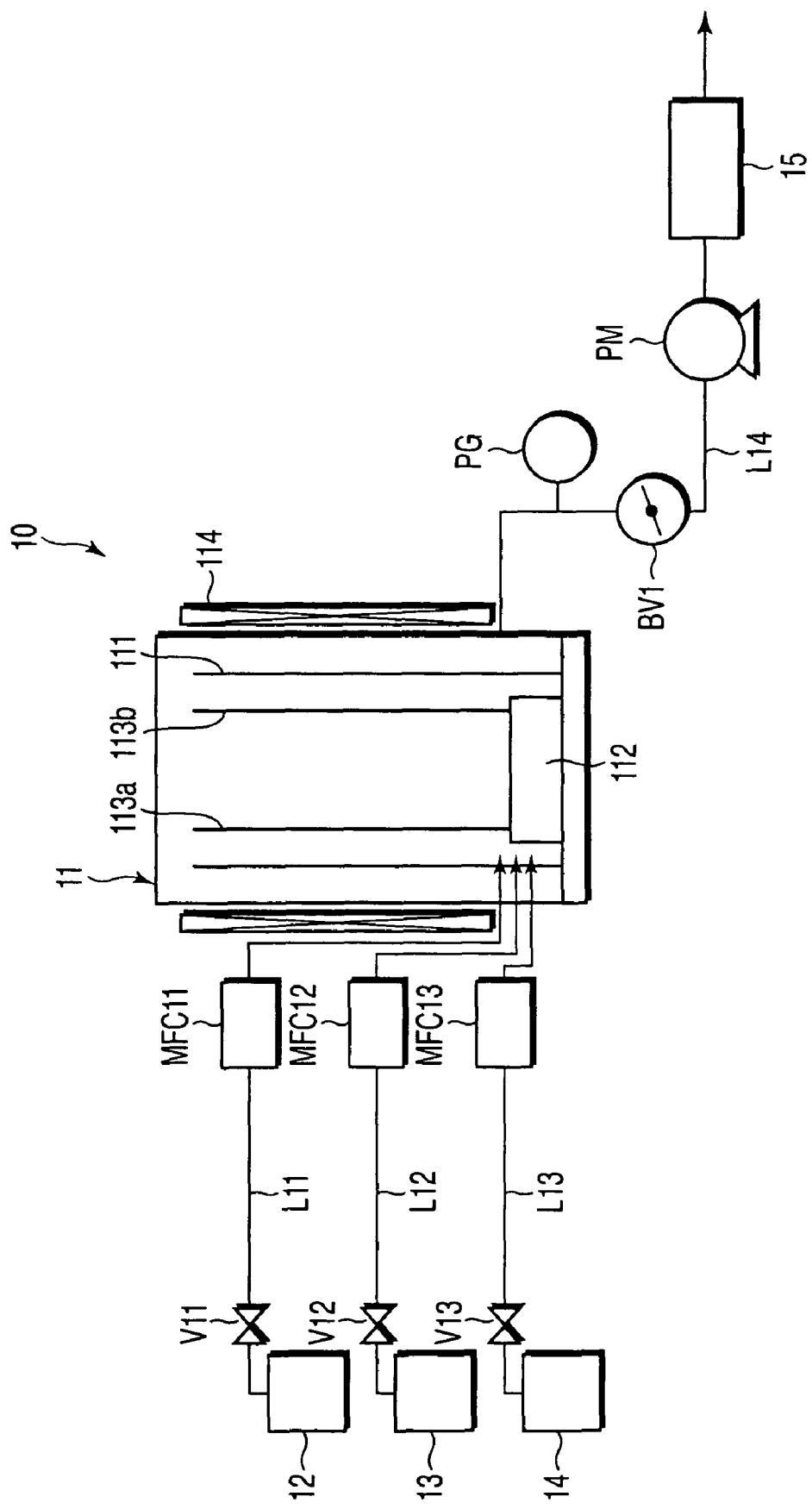
FIG. 1 is a block diagram illustrating a film-forming apparatus equipped with a cleaning system according to an embodiment of the invention.

The present inventors have found that a silicon nitride material deposited on a quartz member or a silicon carbide member and a silicon oxide material deposited on a silicon carbide member can be selectively cleaned off in a short period of time by using a mixture of fluorine gas and carbon monoxide gas.

In one aspect, the present invention relates to a method of cleaning a film-forming apparatus to at least partially remove silicon-based deposits on a constituent member or members of the film-forming apparatus by introducing a cleaning gas into the film-forming apparatus. A gas mixture comprising a first gas comprising fluorine gas ($F_2$) and a second gas comprising carbon monoxide gas (CO) is used as the cleaning gas.

In one embodiment, the film-forming apparatus in which usual deposition processes to form silicon-based films have been carried out is vented firstly.

The film-forming apparatus includes, for example, a CVD reaction chamber, and introduction and exhaust lines (pipes) for CVD raw material gases. A member for disposing thereon a semiconductor wafer on which the silicon-based film is to be formed (for example, a boat in the case of a batch type film-forming apparatus or a susceptor in the case of a single wafer type film-forming apparatus) is arranged within the film-forming apparatus. The constituent members of the film-forming apparatus include the CVD reaction chamber, the piping attached to the CVD reaction chamber and the member for disposing a semiconductor wafer thereon. In general, the wall of the CVD reaction chamber is formed of quartz in the case of a batch type film-forming apparatus, and is formed of quartz or stainless steel in the case of a single wafer type film-forming apparatus. On the other hand, the member for disposing a semiconductor wafer thereon is generally formed of quartz, silicon carbide (SiC) or a carbon material having its surface coated with silicon carbide. The film-forming apparatus is used to form a silicon dioxide film or a silicon nitride film as the silicon-based thin film. The pipes are usually formed of quartz or stainless steel. In the present invention, the silicon nitride material deposited on the quartz member or the silicon carbide member (including a member at lease whose surface is formed of silicon carbide), or the silicon oxide material deposited on the constituent member at least whose surface is formed of silicon carbide is cleaned off.

After the evacuation of the film-forming apparatus as noted above, the constituent members of the film-forming apparatus are heated. In the case of a batch type film-forming apparatus, the CVD reaction chamber is heated by a heater arranged around the CVD reaction chamber. At this time, the semiconductor wafer disposing boat arranged within the CVD reaction chamber is also heated. In the case of a single wafer type film-forming apparatus, the susceptor is heated by a heater provided within the susceptor. Note that even in the case of a single wafer type film-forming apparatus, it is possible to arrange a heater around the CVD reaction chamber so as to have the CVD reaction chamber heated by the heater.

After heating the constituent members in this way, a first gas comprising fluorine gas and a second gas comprising carbon monoxide gas are introduced into the CVD reaction chamber. An inert diluent gas may also be introduced into the CVD reaction chamber. As the inert diluent gas, a rare gas such as argon gas, or nitrogen gas may be used.

In the cleaning process with the first gas (fluorine gas) and the second gas (carbon monoxide gas), the pressure inside the CVD reaction chamber may be maintained at 0.1 Torr to 760 Torr.

In cleaning, it is preferred that the flow rate ratio ($CO/F_2$ flow rate ratio) of the second gas (carbon monoxide gas) to the first gas (fluorine gas) is set such that the etching selectivity of the silicon-based deposit to the constituent member of the film-forming apparatus becomes 1 or more. More specifically, it is preferred that the $CO/F_2$ flow rate ratio is set at 0.22 or less in the case of cleaning off the silicon nitride deposit on the quartz member. On the other hand, it is preferred that the $CO/F_2$ flow rate ratio is set at 0.23 or less in the case of cleaning off the silicon nitride deposit on the silicon carbide member. Further, it is preferred that the $CO/F_2$ flow rate ratio is set at 0.4 or less in the case of cleaning off the silicon oxide deposit on the silicon carbide member. In particular, it is preferred that the etching selectivity of the silicon nitride deposit to the silicon carbide member is 100 or more, in which case $CO/F_2$ flow rate ratio is preferably set at 0.12 or more but 0.20 or less. Further, it is preferred that the etching selectivity of the silicon nitride deposit to the quartz member is 10 or more, in which case $CO/F_2$ flow rate ratio is preferably set at 0.11 or more but 0.20 or less.

The cleaning according to the present invention can be carried out at a temperature of from room temperature to 1,000° C. However, at a high temperature higher than 300° C. or at a low temperature lower than 100° C., the difference in the etching rate between the silicon-based deposit to be cleaned off and the constituent member of the film-forming apparatus tends to become small. Thus, the cleaning is carried out preferably at a temperature of 100° C. to 300° C.

The second gas (CO gas) increases the etching rate of the silicon-based deposit, but does not significantly damage the constituent members of the film-forming apparatus. Thus, the silicon-based deposit can be selectively cleaned off while suppressing the damage to the constituent member of the film-forming apparatus.

It should be noted that the fluorine gas can be generated on site and the synthesized fluorine gas can be introduced into the CVD reaction chamber directly or after being stored temporarily. In view of the safety, it is impossible to fill the fluorine gas in a gas cylinder at high pressure. Therefore, it is difficult to carry out the cleaning operation for a long time or clean a plurality of film-forming apparatuses in parallel when utilizing the fluorine gas supplied from the gas cylinder. The difficulty noted above can be overcome by synthesizing the fluorine gas on site. Electrolysis of HF can be employed for synthesizing the fluorine gas. Long-term cleaning and cleaning of a plurality of apparatuses in parallel can be carried out using the fluorine on-site production system utilizing electrolysis of HF, without limitation on the supply amount of fluorine gas, which is limited by the volume of the cylinder in the case of the supply from the cylinder. A device for producing fluorine gas by the electrolysis of HF is commercially available.

Needless to say, the cleaning operation is not carried out every time a silicon-based thin film forming process is carried out. In general, the cleaning operation is carried out after the silicon-based material has deposited on the constituent members such as the inner wall of the CVD reaction chamber to an unacceptably large thickness by several silicon-based film forming processes.

The present invention will be further described below with reference to the accompanying FIGURES. Throughout the FIGURES, the same elements are denoted by the same reference symbols, and the detailed explanations thereof will be omitted for simplicity.

FIG. 1 is a block diagram illustrating a film-forming apparatus equipped with a cleaning system according to an embodiment of the present invention. This film-forming apparatus is of the type that a first gas (fluorine gas) and a second gas (carbon monoxide gas) are introduced separately into a CVD reaction chamber.

The film-forming apparatus 10 shown in FIG. 1 comprises a CVD reaction chamber 11, a supply source 12 of a first gas (fluorine gas), a supply source 13 of a second gas (carbon monoxide gas), and a supply source 14 of an inert diluent gas supplied where necessary.

The CVD reaction chamber 11 is constituted by a reaction furnace made of, for example, quartz, and a process tube 111 made of, for example, quartz is arranged therein. A semiconductor substrate supporting table 112, and a pair of rods 113a and 113b made of quartz each provided with a plurality of grooves, into which semiconductor substrates (not shown) are inserted to be held, are arranged within the process tube 111. The pair of the quartz rods 113a and 113b collectively constitute a so-called "boat". A heater 114 surrounds the CVD reaction chamber 11. After formation of the silicon-based thin film, the semiconductor substrate is removed from the boat (rods 113a, 113b). The CVD reaction chamber 11 is heated to a prescribed temperature by the heater 114.

The fluorine gas forming the first gas is supplied from the supply source 12 (e.g., a gas cylinder) into the CVD reaction chamber 11 through a fluorine gas supply line L11. An on-off valve V11 is mounted on the line L11, and a flow rate controller, for example, a mass flow controller MFC 11, is mounted on the line L11 downstream of the valve V11. The fluorine gas has its flow rate adjusted to a prescribed level by the mass flow controller MFC 11 and is introduced into the CVD reaction chamber 11.

The carbon monoxide gas forming the second gas is supplied from the supply source 13 (e.g., a gas cylinder) into the CVD reaction chamber 11 through a second gas supply line L12. An on-off valve V12 is mounted on the supply line L12 and a flow rate controller, e.g., a mass flow controller MFC 12 is mounted on the line L12 downstream of the valve V12. The carbon monoxide gas has its flow rate adjusted to a prescribed level by the mass flow controller MFC 12 and is introduced into the CVD reaction chamber 11.

The inert diluent gas is supplied, where necessary, from the supply source 14 (e.g., a gas cylinder) into the CVD reaction chamber 11 through an inert diluent gas supply line L13. An on-off valve V13 is mounted on the supply line L13, and a flow rate controller, e.g., a mass flow controller MFC 13, is mounted on the supply line L13 downstream of the valve V13. The inert diluent gas has its flow rate adjusted to a prescribed level by the mass flow controller MFC 13 and is introduced into the CVD reaction chamber 11.

The outlet port of the CVD reaction chamber 11 is connected to a waste gas treatment unit 15 via a line L14. The waste gas treatment unit 15 is dedicated to remove the by-products, the unreacted reactants, etc. and the gas cleaned by the waste gas treatment unit 15 is exhausted to the outside of the system. Mounted on the line L14, there are a pressure sensor PG, a pressure controller such as a butterfly valve BV1, and a vacuum pump PM. The pressure inside the CVD reaction chamber 11 is monitored by the pressure sensor PG and is set at a prescribed pressure value by controlling the opening-closing degree of the butterfly valve BV1.

Needless to say, supply systems (not shown) of CVD raw material gases for performing the ordinary CVD reaction (for forming a silicon-based thin film) is connected to the CVD reaction chamber 11.

With the film-forming apparatus 10 shown in FIG. 1, it is possible to clean off the silicon nitride material deposited on, for example, the inner wall of the CVD reaction chamber 11, on the inner and outer surfaces of the process tube 111, and on the quartz rods 113a and 113b by the cleaning method of the present invention after formation of the silicon nitride films on the semiconductor substrates.

FIG. 2 is a block diagram schematically illustrating a film-forming apparatus of the type that the first gas and the second gas are mixed in advance, and the mixture is introduced into the CVD reaction chamber 11. The apparatus shown in FIG. 2 has a similar construction to the film-forming apparatus 10 shown in FIG. 1. In FIG. 2, those elements or members which correspond to those in FIG. 1 are denoted by the same reference numerals, and the detailed explanations thereof are omitted for simplicity.

In the case where the first gas and the second gas are mixed in advance, and the mixture is introduced into the CVD reaction chamber, it is preferred to first mix the diluent gas with one of the first and second gases, and then the mixture is added with the other one of the first and second gases, in order to prevent the lowering of the cleaning rate due to the reaction of the first and second gases at high concentration before these gases are introduced into the CVD reaction chamber.

In the film-forming apparatus shown in FIG. 2, the first gas supply line L11 and the second gas supply line L12 are independently combined with the inert diluent gas supply line L13 upstream of the CVD reaction chamber 11 and downstream of the mass flow controllers MFC 11 and MFC 12, respectively. With this arrangement, the diluent gas and one of the first and second gases can be mixed first in the line, and then the mixture can be added with the other one of the first and second gases, by controlling the order of the on-off operation of the valves V11, V12 and V13.

Figure 3:
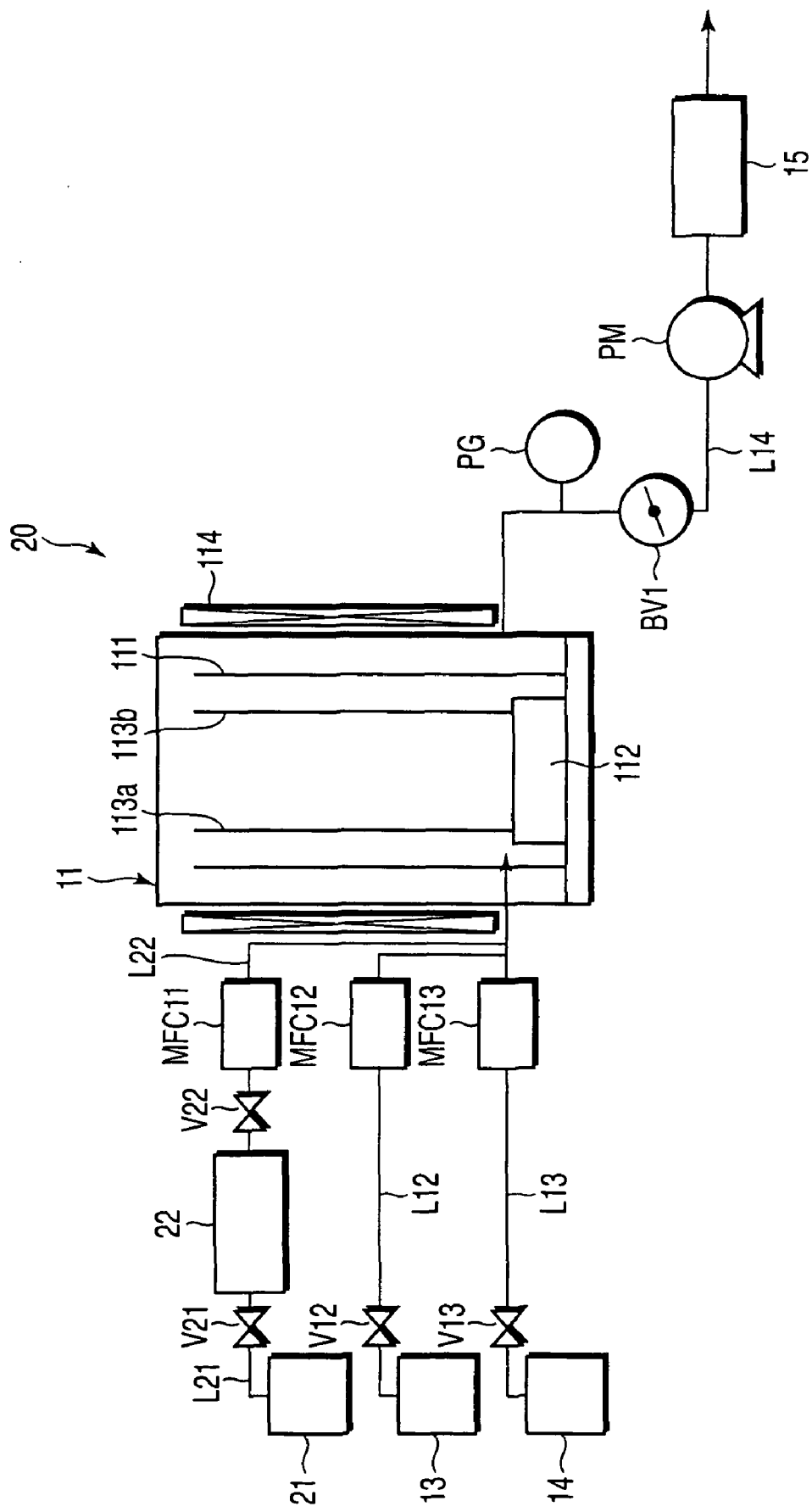
FIG. 3 is a block diagram illustrating a film-forming apparatus equipped with a cleaning system according to still another embodiment of the invention.

FIG. 3 is a block diagram schematically showing a film-forming apparatus 20, which has the same construction as in FIG. 2, except that the apparatus 20 shown in FIG. 3 comprises a system for producing fluorine gas on site. Those elements of the film-forming apparatus 20 shown in FIG. 3 which correspond to those in FIG. 2 are denoted by the same reference numerals, and the detailed explanations thereof are omitted for simplicity.

The film-forming apparatus 20 shown in FIG. 3 is provided with a hydrogen fluoride (HF) gas supply source 21 and a fluorine gas producing device 22 for producing fluorine gas by the electrolysis of HF, in place of the fluorine gas supply source 12 in the film-forming apparatus shown in FIG. 2. The HF gas is supplied from the HF gas supply source 21 into the fluorine gas producing device 22 through a HF gas supply line L21. An on-off valve V21 is mounted on the HF gas supply line L21. A buffer tank (not shown) may be provided to temporarily store the produced fluorine gas, downstream of the fluorine gas producing device 22. A supply line L22 for the produced fluorine gas is combined with the inert diluent gas supply line L13, independent of the carbon monoxide gas supply line L12. An on-off valve V22 is mounted on the line L22, and a flow rate controller, e.g., a mass flow controller MFC 11, is mounted on the line L22 downstream of the on-off valve V22. The fluorine gas has its flow rate adjusted to a prescribed level by the mass flow controller MFC 11 and is introduced into the CVD reaction chamber 11.

In the system shown in FIG. 3, the fluorine gas is mixed in advance with the second gas (CO gas) and the mixed gas is introduced into the CVD reaction chamber 11. However, it is also possible to introduce the fluorine gas and the CO gas separately into the CVD reaction chamber 11, as in the film-forming apparatus 10 shown in FIG. 1.

Further, the gas supply systems are not limited to those shown in FIGS. 1, 2 and 3. For example, the diluent gas and one of the fist and second gases can be mixed in advance and introduced into the CVD reaction chamber 11, while the other one of the first and second gases can be directly introduced into the CVD reaction chamber 11.

Figure 4:
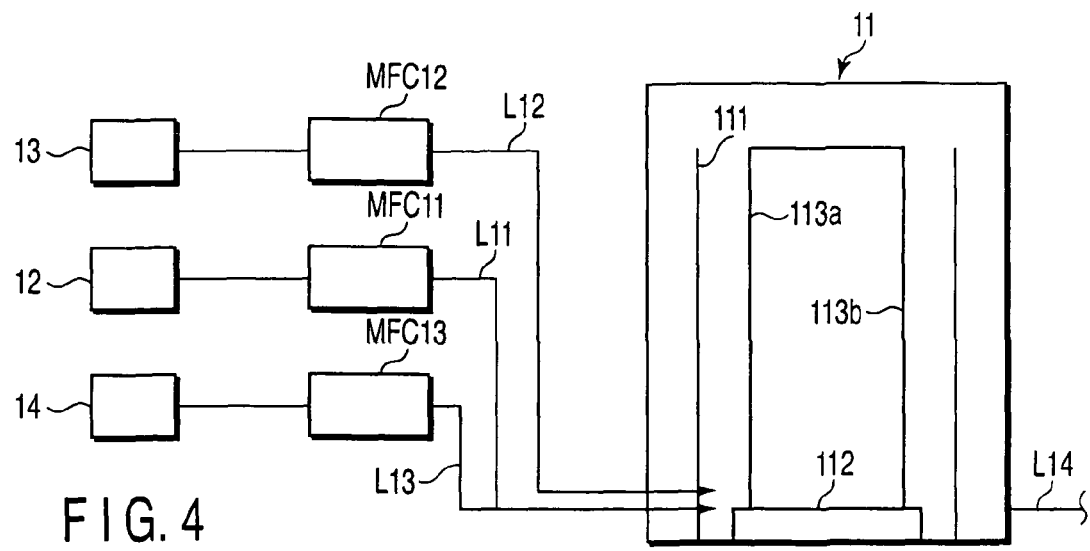
FIG. 4 is a block diagram illustrating a film-forming apparatus equipped with a cleaning system according to still another embodiment of the invention.

FIG. 4 shows an example wherein upstream of the reaction chamber 11, the supply line L11 from the first gas source 12 is combined with the supply line L13 from the diluent gas source 14 downstream of the mass flow controller MFC 13.

Furthermore, a plurality of gas outlet pipes (branch pipes) may be mounted on at least one of the supply lines of first and second gases so as to form a manifold, in order to uniformly supply the gas into the reaction chamber.

Figure 5:
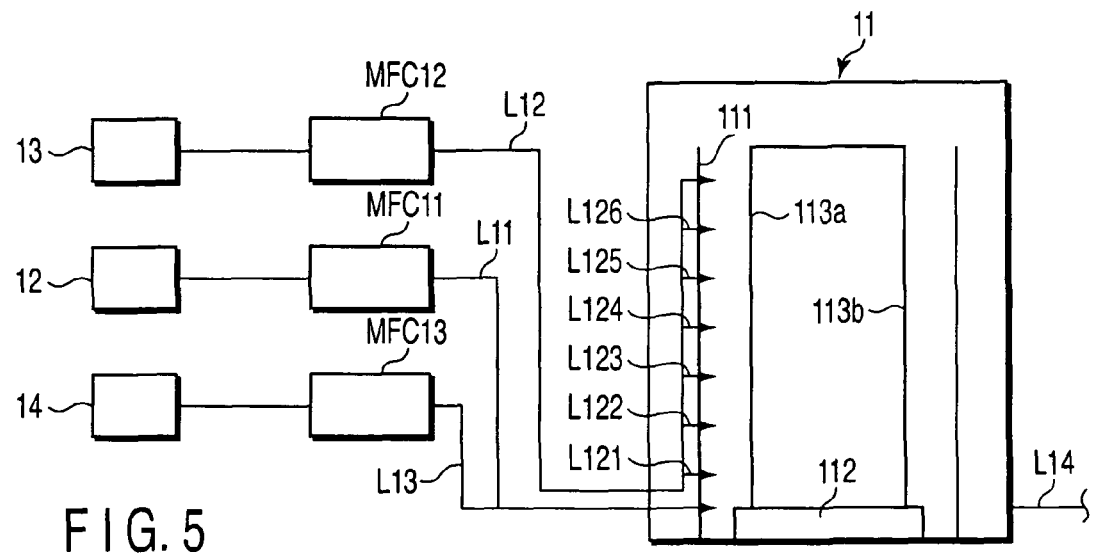
FIG. 5 is a block diagram illustrating a film-forming apparatus equipped with a cleaning system according to still another embodiment of the invention.

FIG. 5 shows an example in which the supply line L12 of the second gas has, within the reaction chamber, a plurality of branched pipes (6 branch pipes L121-L126 in FIG. 5), in a gas supply system similar to that of FIG. 4.

Figure 6:
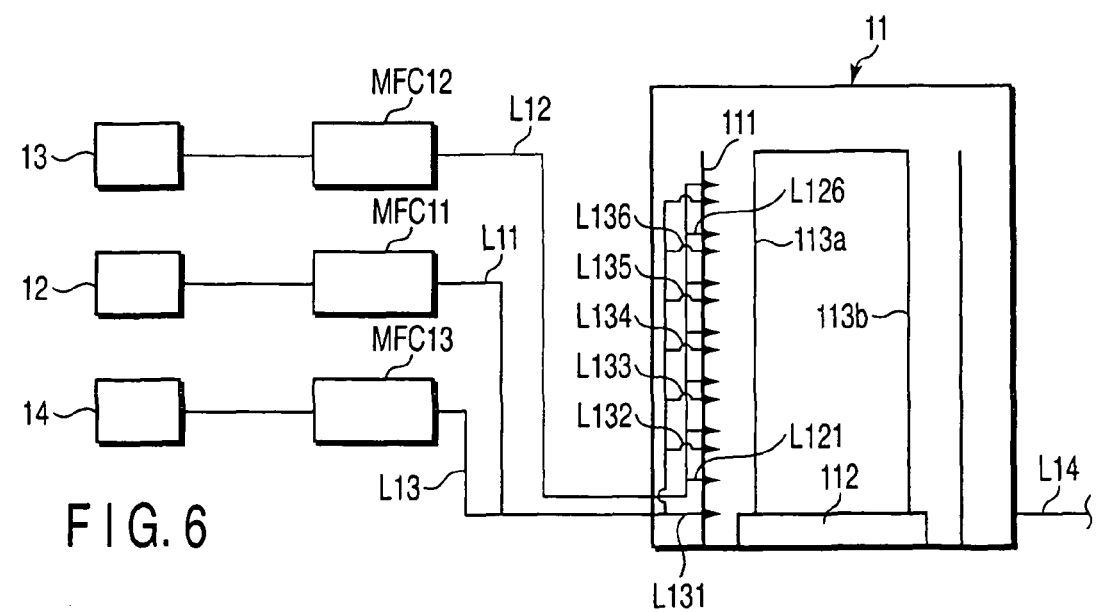
FIG. 6 is a block diagram illustrating a film-forming apparatus equipped with a cleaning system according to still another embodiment of the invention.

Further, FIG. 6 shows an example in which not only the second gas supply line L12, but also the diluent gas supply line L13 has a plurality of branched pipes (6 branch pipes L131-L136 in FIG. 6) positioned downstream of the combined point with the supply line L11 of the first gas, in a gas supply system similar to that of FIG. 5.

Also, one of the first and second gases can be bypassed and supplied into the exhaust line L14, in order to increase the cleaning rate of the exhaust line L14. The cleaning rate of the exhaust line L14, positioned on the most downstream side, tends to be lowered, but may be increased by additionally supplying one of the first and second gases thereinto from a bypass line.

FIG. 7 shows an example in which the second gas supply line L12 has, downstream of the mass flow controller MFC 12, a bypass line L30, which branches from the supply line L12 upstream of the reaction chamber 11, and is directly combined with the exhaust line L14.

The embodiments described above are directed to a batch type film-forming apparatus. Needless to say, however, the present invention can be applied to a single wafer type film-forming apparatus, as mentioned above.

As apparent from the description given above, the present invention makes it possible to selectively clean off the silicon nitride material deposited on quartz or silicon carbide, or the silicon oxide material deposited on silicon carbide.

The present invention will now be described by way of its Examples. Needless to say, however, the present invention is not limited to the following Examples. Note that quartz used in the following Examples can be considered a silicon oxide deposit.

Example 1

A sample having silicon nitride deposited thereon and a quartz sample were housed in a CVD reaction chamber. Then, fluorine gas, carbon monoxide gas and nitrogen gas were introduced into the CVD reaction chamber to carry out a cleaning operation under the conditions given below:
  Fluorine gas flow rate: 500 sccm
  Carbon monoxide gas flow rate: 100 sccm
  Nitrogen gas flow rate: flow rate such that the total gas flow rate becomes 1000 sccm
  Pressure inside the CVD reaction chamber: 50 Torr
  Cleaning temperature: 150, 175, 200, 250 or 300° C.

FIG. 8 shows the etching rates of the silicon nitride and quartz at each temperature. In FIG. 8, line a relates to the results on the silicon nitride and line b relates to the results on the quartz. As is apparent from the results shown in FIG. 8, silicon nitride can be selectively cleaned off with respect to quartz according to an embodiment of the present invention.

Example 2

A sample having silicon nitride deposited thereon and a quartz sample were housed in a CVD reaction chamber. Then, fluorine gas, carbon monoxide gas and nitrogen gas were introduced into the CVD reaction chamber to carry out a cleaning operation under the conditions given below:
  Fluorine gas flow rate: 500 sccm
  Carbon monoxide gas flow rate: 100 or 200 sccm ($CO/F_2$ flow rate ratio: 0.2 or 0.4)
  Nitrogen gas flow rate: flow rate such that the total gas flow rate becomes 1000 sccm
  Pressure inside the CVD reaction chamber: 50 Torr
  Cleaning temperature: 150, 200, 250 or 300° C.

The etching rates of the silicon nitride and quarts at each temperature were measured, and the etching selectivity (SiN/quartz) was calculated. The results are shown in FIG. 9. In FIG. 9, line a relates to the results on the $CO/F_2$ flow rate ratio of 0.2 and line b relates to the results on the $CO/F_2$ flow rate ratio of 0.4. As is apparent from the results shown in FIG. 9, SiN/quartz etching selectivity is particularly high at a $CO/F_2$ flow rate ratio of 0.2 under 200° C. condition.

Example 3

A sample having silicon nitride deposited thereon, a quartz sample and a silicon carbide sample were housed in a CVD reaction chamber. Then, fluorine gas, carbon monoxide gas and nitrogen gas were introduced into the CVD reaction chamber to carry out a cleaning operation under the conditions given below. As the cleaning temperature, a temperature of 200° C. was used, at which a high SiN/quartz etching selectivity was obtained in Example 2.
  Fluorine gas flow rate: 500 sccm
  Carbon monoxide gas flow rate: 25-200 sccm
  Nitrogen gas flow rate: flow rate such that the total gas flow rate becomes 1000 sccm
  Pressure inside the CVD reaction chamber: 50 Torr
  Cleaning temperature: 150, 200, 250 or 300° C.

The etching rates of the silicon nitride, quarts and silicon carbide at each $CO/F_2$ flow rate ratio were measured, and the etching selectivity was calculated. The results are shown in Table 1 below. Of the results, the results relating to the etching rate are illustrated in FIG. 10. In FIG. 10, line a relates to the results on SiN, line b relates to the results on quartz and line c relates to the results on SiC.

TABLE 1

| Flow Rate (sccm) | | $CO/F_2$ Flow Rate Ratio | Etching Rate (Å/min) | | | Etching Selectivity | | |
|---|---|---|---|---|---|---|---|---|
| CO | $F_2$ | | SiN | quartz | SiC | SiC/quartz | quartz/SiC | SiN/SiC |
| 0 | 0 | 0 | 0 | 0 | 0 | | | |
| 25 | 500 | 0.05 | 85 | 20 | | 4.3 | | |
| 50 | 500 | 0.10 | 63 | 25 | 1 | 2.5 | 25 | 63 |
| 75 | 500 | 0.15 | 310 | 40 | | 7.8 | | |
| 100 | 500 | 0.20 | 748 | 63 | 3 | 11.9 | 21 | 249 |
| 107 | 500 | 0.21 | 1288 | 258 | | 5.0 | | |
| 113 | 500 | 0.22 | 1912 | 2841 | 148 | 0.7 | 19 | 13 |
| 200 | 500 | 0.4 | 5039 | 8567 | 859 | 0.6 | 10 | 6 |

From the results shown in FIG. 10 (Table 1), the following is confirmed. Note that in the following discussion, the values other than the plotted points in FIG. 10 (Table 1) were obtained by linear approximation between the plotted points.

With respect to silicon nitride/quartz, the data of the etching rate in FIG. 10 at the $CO/F_2$ flow rate ratios of 0.21 and 0.22 were linearly interpolated, and the value of the flow rate ratio at the intersection point was determined to be 0.22. Thus, it can be said that the silicon nitride/quartz etching selectivity of 1 or more can be attained at the $CO/F_2$ flow rate ratio of 0.22 or less. Similarly, it has been confirmed that the silicon nitride/quartz etching selectivity of 5 or more can be attained at the $CO/F_2$ flow rate ratio of 0.21 or less, and the silicon nitride/quartz etching selectivity of 10 or more can be attained at the $CO/F_2$ flow rate ratio in the range of 0.11 or more but 0.20 or less.

Likewise, with respect to silicon nitride/SiC, it has been confirmed that the silicon nitride/SiC etching selectivity of 10 or more can be attained at the $CO/F_2$ flow rate ratio of 0.23 or less, and the silicon nitride/SiC etching selectivity of 100 or more can be attained at the $CO/F_2$ flow rate ratio in the range of 0.12 or more but 0.20 or less.

Further, with respect to silicon oxide/SiC, it has been confirmed that the silicon oxide/SiC etching selectivity of 10 or more can be attained at the $CO/F_2$ flow rate ratio of 0.40 or less.

Comparative Examples 1-3

A sample having silicon nitride deposited thereon and a quartz sample were housed in a CVD reaction chamber. Then, $COF_2$ gas, fluorine gas, carbon monoxide gas and nitrogen gas were introduced into the CVD reaction chamber under the conditions specified below to carry out a cleaning operation at 200° C., with the pressure inside the CVD reaction chamber set at 50 Torr.

Comparative Example 1

$COF_2$ gas flow rate: 200 sccm
Fluorine gas flow rate: 0 sccm
Carbon monoxide gas flow rate: 0 sccm
Nitrogen gas flow rate: flow rate such that the total gas flow rate becomes 1000 sccm Comparative Example 2

$COF_2$ gas flow rate: 200 sccm
Fluorine gas flow rate: 0 sccm
Carbon monoxide gas flow rate: 200 sccm
Nitrogen gas flow rate: flow rate such that the total gas flow rate becomes 1000 sccm Comparative Example 3

$COF_2$ gas flow rate: 200 sccm
Fluorine gas flow rate: 500 sccm
Carbon monoxide gas flow rate: 0 sccm
Nitrogen gas flow rate: flow rate such that the total gas flow rate becomes 1000 sccm As a result, the SiN and quartz were not etched in any of Comparative Examples 1-3.

Comparative Examples 4-5

A sample having silicon nitride deposited thereon and a quartz sample were housed in a CVD reaction chamber. Then, $CF_3OF$ gas, fluorine gas and nitrogen gas were introduced into the CVD reaction chamber under the conditions specified below to carry out a cleaning operation at 200° C., with the pressure inside the CVD reaction chamber set at 50 Torr.

Comparative Example 4

$CF_3OF$ gas flow rate: 200 sccm
Fluorine gas flow rate: 0 sccm
Nitrogen gas flow rate: flow rate such that the total gas flow rate becomes 1000 sccm Comparative Example 5

$CF_3OF$ gas flow rate: 200 sccm
Fluorine gas flow rate: 500 sccm
Nitrogen gas flow rate: flow rate such that the total gas flow rate becomes 1000 sccm As a result, the SiN and quartz were not etched in any of Comparative Examples 4-5.

As described above, according to the present invention, silicon-base deposits can be cleaned off at a high rate and in a short period of time, without damaging the constituent members of the film-forming apparatus.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A method for etching a silicon-based material deposited on a constituent member of a film-forming apparatus, comprising:
    forming a cleaning gas consisting essentially of $F_2$ gas, CO gas, and a diluent gas by separately introducing said $F_2$ gas, said CO gas, and said diluent gas into said apparatus;
    heating said constituent member present in said apparatus to a temperature within the range of 100° C. to 300° C.; and
    while the constituent member is at a temperature within the range of 100° C. to 300° C., contacting the heated constituent member with said cleaning gas to selectively etch said silicon-based material deposited on said constituent member,
    wherein the silicon-based material comprises silicon nitride and the constituent member comprises quartz, and
    wherein a flow rate ratio of the CO gas to the F2 gas is 0.11 to 0.20 such that the cleaning gas selectively etches silicon nitride from quartz.

2. The method according to claim 1, further comprising electrolyzing HF to form said $F_2$ gas.

3. The method according to claim 1, wherein said diluent gas is selected from the group consisting of a rare gas and nitrogen gas.

4. The method according to claim 1, wherein said diluent gas is selected from the group consisting of argon gas and nitrogen gas.

5. The method according to claim 1, wherein a pressure inside said apparatus is from 0.1 to 760 Torr.

6. The method according to claim 1, wherein a pressure inside said apparatus is from 50 to 760 Torr.

7. The method according to claim 1, wherein a flow rate ratio of the CO gas to the $F_2$ gas is from 0.15 to 0.20.

8. The method according to claim 1, wherein said constituent member present in said apparatus is heated to a temperature of from 150° C. to 300° C.

9. The method according to claim 1, wherein said constituent member present in said apparatus is heated to a temperature of from 175° C. to 300° C.

10. The method according to claim 1, wherein said constituent member present in said apparatus is heated to a temperature of from 200° C. to 300° C.

11. The method according to claim 1, wherein said constituent member present in said apparatus is heated to a temperature of from 250° C. to 300° C.

12. The method according to claim 1, wherein the silicon-based material is silicon nitride and the constituent member comprises quartz.

13. The method according to claim 1, wherein the silicon-based material comprises silicon nitride and the constituent member is quartz.

14. The method according to claim 1, wherein the silicon-based material is silicon nitride and the constituent member is quartz.

15. The method according to claim 1, wherein said apparatus comprises a CVD chamber, and said cleaning gas is present in said CVD chamber.

16. The method according to claim 15, wherein said CVD chamber comprises a quartz reaction furnace; a semiconductor substrate supporting table; and two quartz rods having a plurality of grooves.

17. The method according to claim 15, wherein a heater surrounds said CVD chamber.

* * * * *